United States Patent [19]

Shima et al.

[11] Patent Number: 4,946,802
[45] Date of Patent: Aug. 7, 1990

[54] SEMICONDUCTOR LASER DEVICE FABRICATING METHOD

[75] Inventors: Akihiro Shima; Wataru Susaki, both of Hyogo, Japan

[73] Assignee: Mitsubishi Denki Kabushiki Kaisha, Tokyo, Japan

[21] Appl. No.: 273,393

[22] Filed: Nov. 18, 1988

Related U.S. Application Data

[62] Division of Ser. No. 54,764, May 27, 1987, Pat. No. 4,813,050.

[30] Foreign Application Priority Data

May 31, 1986 [JP] Japan ................................ 61-126505

[51] Int. Cl.$^5$ ............................................. H01L 21/20
[52] U.S. Cl. ............................ 437/129; 148/DIG. 95; 148/DIG. 110; 156/610; 372/46; 437/117; 437/133
[58] Field of Search ................... 148/DIG. 29, 50, 51, 148/95, 110, 119, 169, 101, 72; 156/610–615; 357/16, 17; 372/43–48; 437/81, 107, 117, 119, 126, 129, 133

[56] References Cited

U.S. PATENT DOCUMENTS

| | | | |
|---|---|---|---|
| 4,523,317 | 6/1985 | Botez | 372/48 |
| 4,679,200 | 7/1987 | Matsui et al. | 372/45 |
| 4,689,797 | 8/1987 | Olshansky | 372/45 |
| 4,745,611 | 5/1988 | Hamada et al. | 372/46 |
| 4,783,788 | 11/1988 | Gordon | 372/45 |
| 4,815,082 | 3/1989 | Isshiki et al. | 357/17 |
| 4,819,245 | 4/1989 | Morimoto et al. | 372/48 |

FOREIGN PATENT DOCUMENTS

| | | | |
|---|---|---|---|
| 0164284 | 9/1983 | Japan | 437/129 |
| 0149078 | 8/1984 | Japan | 372/48 |
| 0000789 | 1/1985 | Japan | 372/48 |
| 140774 | 7/1985 | Japan | . |
| 0167488 | 8/1985 | Japan | 372/48 |
| 0042188 | 2/1986 | Japan | 372/48 |
| 0281576 | 12/1986 | Japan | 372/48 |

OTHER PUBLICATIONS

T. Murakami et al, "High-Power AlGaAs Laser With a Thin Tapered-Thickness Active Layer", *Electronics Letters*, 13 Feb. 1986, vol. 22, No. 4, pp. 217–218.

*Primary Examiner*—Brian E. Hearn
*Assistant Examiner*—William Bunch
*Attorney, Agent, or Firm*—Lowe, Price, LeBlanc, Becker & Shur

[57] ABSTRACT

A high-power AlGaAs/GaAs laser device comprises: a ridge formed on the top surface of a substrate from one end to the opposite end, thereof wherein the width of the ridge is made narrower in regions near both the ends and wider in a middle region; a depression is formed in the wider region of the ridge; a clad layer is grown epitaxially over the top surface of the substrate; and an active layer is grown epitaxially on the clad layer, wherein the thickness of the active layer is thinner in portions just above the narrower ridge regions and relatively thicker in a portion just above the wider ridge region.

6 Claims, 4 Drawing Sheets

SEMICONDUCTOR LASER DEVICE FABRICATING METHOD

This is a division of application Ser. No. 054,764 filed May 27, 1987 now U.S. Pat. No. 4,813,050.

BACKGROUND OF THE INVENTION

1. Field of the Invention

This invention is related to a semiconductor laser device and more particularly to a high-power laser device and a fabricating method thereof.

2. Description of the Prior Art

In a conventional high-power laser device of an AlGaAs/GaAs system, the mirror facets at both the ends of the laser device absorb the laser beam and this sometimes results in melting or demolition of the crystal. This phenomenon is called COD (Catastrophic Optical Damage) and it limits the available power level of the laser device. It is known in the prior art that it is effective for increasing the available power level limited by COD to provide a laser device with a very thin active layer in order to lower the power density at the mirror. The power density is lowered because of the weaker confinement of light in the thinner active layer. As the active layer becomes thinner, however, the threshold current increases because of decrease in the gain.

Referring to FIG. 1, there is schematically shown a perspective view of an improved AlGaAs/GaAs laser device with a part cut away, which is described in ELECTRONICS LETTERS, 13th Feb. 1986, Vol. 22, No. 4, pp. 217-218 by T. Murakami et al. An n-GaAs current-blocking layer 5, a p-AlGaAs clad layer 2, a p-AlGaAs active layer 3, an n-AlGaAs clad layer 4 and an n-GaAs contact layer 7 are stacked in this order on a substrate 1 which has a ridge on its top surface from one end to the opposite end. The width of the ridge is narrower in regions 8a near the end and much wider in an middle region 8b. The end surfaces of the substrate are of $(01\bar{1})$ and $(0\bar{1}1)$ while the side surfaces are of (011) and $(0\bar{1}\bar{1})$. The current-blocking layer 5 is provided with a slit opened by a narrow groove 10 along the center axis of the ridge. This slit provides a stripe structure for current in the laser device.

In the meantime, it is known that the crystal growth rate in liquid phase epitaxy depends on the surface orientation of the substrate.

Referring to FIG. 2, there is shown a sectional view illustrating an epitaxial crystal growth on a ridged substrate. In this figure, an epitaxial layer 11 of AlGaAs is grown on a substrate 1 of GaAs which has a narrow ridge 8a on its top surface. As seen, the AlGaAs epitaxial layer 11 grows faster on the (111) and $(1\bar{1}1)$ side facets of the ridge 8a than on the (100) top facet and thus becomes thicker on those side facets. At this time, since the concentration of As is decreased in the liquid phase just above the narrow top facet of the ridge, the growth rate of the AlGaAs layer 11 is further decreased over the narrow top facet. The growth rate of the epitaxial layer over the ridge depends on the height h and width w of the ridge as well as on the other conditions, e.g., temperature, oversaturation, etc. Therefore, the thickness d of the epitaxial layer 11 on the ridge can be controlled by selecting the height h and the width w of the ridge.

Referring to FIG. 3, there is shown a perspective view of the substrate and the current-blocking layer thereon in the laser device of FIG. 1. The same reference characters are used in this figure as in FIG. 1 for the corresponding portions. The ridge is made 20 μm wide in the regions 8a near both the ends and 150 μm wide in the middle region 8b. The active layer 3 of p-AlGaAs grown epitaxially with this substrate has a tapered thickness which is thinner in portions 3a just above the narrower ridge region 8a and thicker in a portion 3b just above the wider ridge region 8b. For example, the active layer portions 3a above the narrower ridge regions 8a can be controlled as thin as 0.04 μm while the active layer portion 3b above the wider ridge region 8b can be made as thick as 0.06 μm.

In the laser device of FIG. 1, the optical power density is lowered in the thinner active layer portions 3a near the mirror facets, while increase of the threshold current can be suppressed with the larger part 3b of the active layer being made thicker. As a result, continuous output of 30 mW can be obtained at a relatively higher temperature of 60° C. with a threshold current of 40–50 mA.

As a matter of fact, however, it is difficult to make a sufficient difference in thickness between the active layer portions 3a and 3b with good reproducibility only by controlling the width of the ridge regions 8a and 8b.

Incidentally, Japanese Patent Laying-Open Gazette No. 60-140774 shows a substrate of a shape similar to that of the present invention. However, the invention of this Gazette is directed to a semiconductor laser with reduced wavefront aberration. In such a semiconductor device, an active layer is formed to preferably have a uniform thickness along the wave guide.

SUMMARY OF THE INVENTION

In view of the prior art, it is a major object of this invention to provide a high-power semiconductor laser device in which a sufficient difference in thickness is made with good reproducibility between each of active layer portions near the mirror facets and an inner active layer portion.

According to an aspect of the present invention, a semiconductor laser device comprises: a substrate; a ridge formed on a main surface of the substrate from one end to the opposite end, wherein the width of the ridge is narrower in regions near both the ends and wider in a middle region; a depression formed in the wider region of the ridge; a first clad layer formed over the main surface of the substrate; an active layer formed on the first clad layer, wherein the thickness of the active layer is small in portions just above the narrower ridge regions and relatively larger in a portion just above the wider ridge region; and a second clad layer formed on the active layer.

According to another aspect of the present invention, a method for fabricating a semiconductor laser device comprises the steps of: preparing a substrate; forming a ridge on a main surface of the substrate from one end to the opposite end, wherein width of the ridge is narrower in regions near both the ends and wider in a middle region; forming a depression in the wider region of the ridge; forming a first clad layer over the main surface of the substrate; forming an active layer on the first clad layer, whereby thickness of the active layer is made thinner in portions just above the narrower ridge regions and made thicker in portion just above the wider ridge region; and forming a second clad layer on the active layer.

These objects and other objects, features, aspects and advantages of the present invention will become more

DESCRIPTION OF THE PREFERRED EMBODIMENTS

Figure 1:
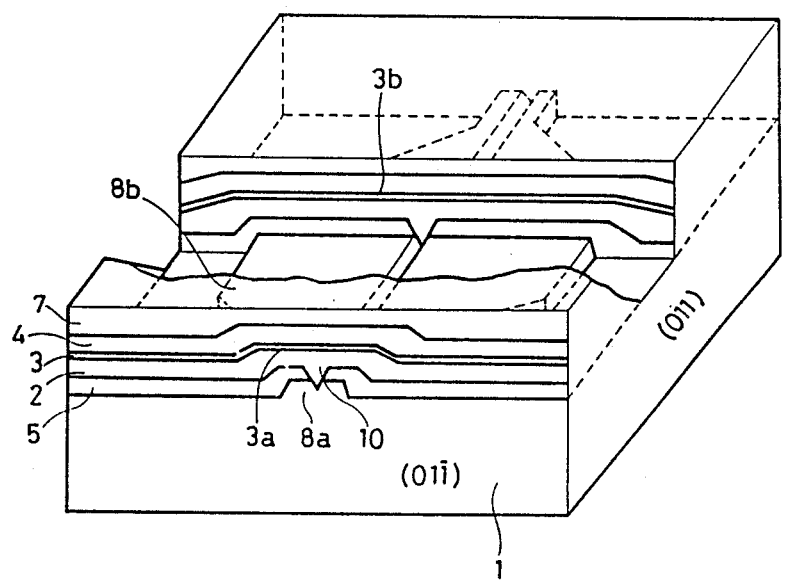
FIG. 1 is a schematic perspective view of a high-power AlGaAs/GaAs laser device of the prior art with a part cut off.
Figure 2:
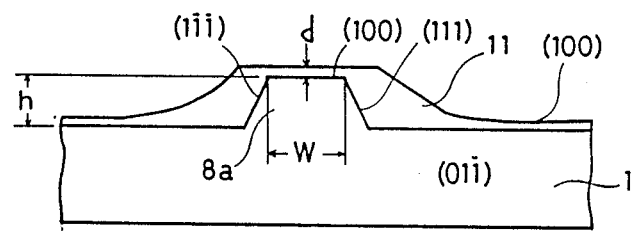
FIG. 2 is a sectional view illustrating an epitaxial growth on a ridged substrate.
Figure 4:
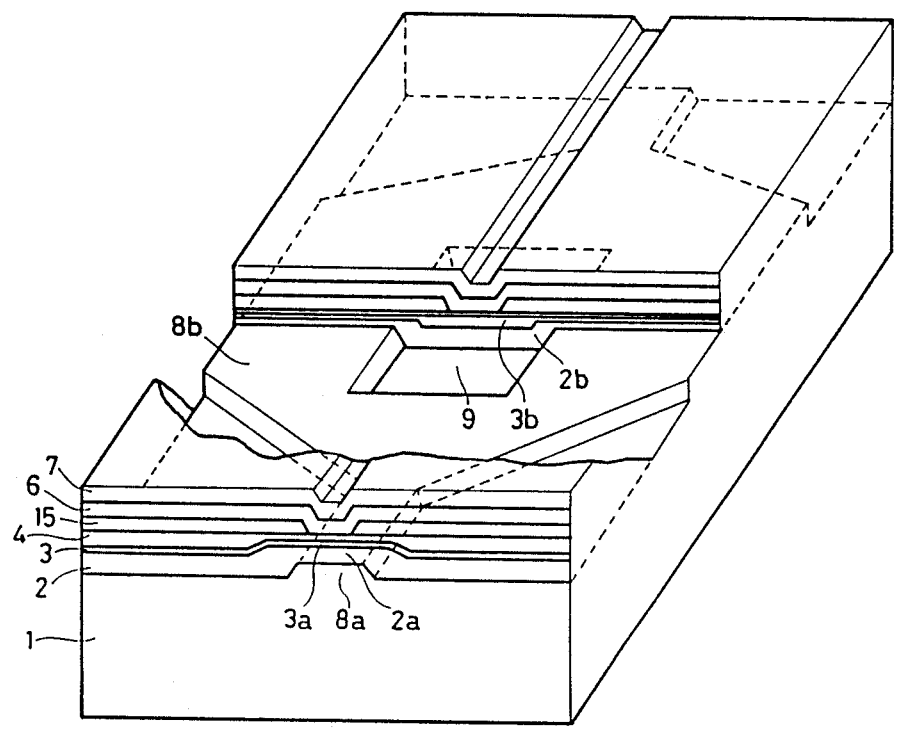
FIG. 4 is a schematic perspective view of a high-power semiconductor laser device according to the present invention with a part cut off.

Referring to FIG. 4, there is shown a schematic perspective view of a high-power AlGaAs/GaAs laser device with a part cut off, according to an embodiment of the present invention. It is noted that the same reference characters are used in this figure as in FIG. 1 for corresponding portions. In the device of FIG. 4, a p-AlGaAs clad layer 2 is grown directly on a substrate 1 having a ridge on the top surface thereof by liquid phase epitaxy. The ridge comprises a narrower region 8a and a wider region 8b. The wider region 8b of the ridge includes a depression 9 along the center axis of the ridge. The epitaxially grown clad layer 2 includes not only a ridged portion 2a which is a little wider than the narrow ridge 8a of the substrate 1 but also a depressed portion 2b corresponding to the depression 9. A p-AlGaAs active layer 3 is then grown on the clad layer 2 by liquid phase epitaxy. The active layer 3 grows thinner in a portion 3a on the ridged portion 2a of the clad layer 2 due to the ridge effect as described above and grows thicker in a portion 3b filling the depressed portion 2b. Thereafter, an n-AlGaAs clad layer 4, a p-GaAs current-blocking layer 15 having a slit along the center axis of the ridge, an n-AlGaAs covering clad layer 6 and an n-GaAs contact layer 7 are formed in this order on the active layer 3 to complete a laser device by a suitable known method.

Figure 5:
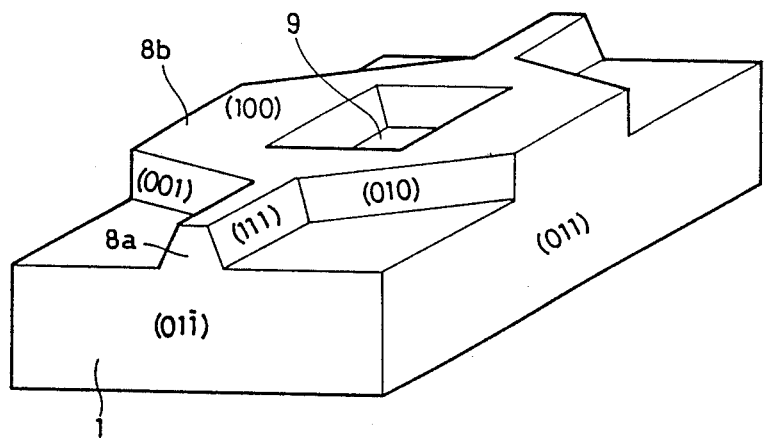
FIG. 5 is a perspective view of a ridged substrate which may be used in the present invention.

Referring to FIG. 5, there is shown a perspective view of the substrate with more detailed crystallographic surface orientations, which is used in the laser device of FIG. 4.

The p-AlGaAs active layer 3 can be more exactly controlled to be thinner in the portions 3a near both the ends of the laser device by selecting the shape (width and height) of the ridge 8a and to be thicker in the inner portion 3b by selecting the shape (width and depth) of the depression 9. With a ridge 8a of 20 μm width and 2 μm height and a depression 9 of 7 μm width and 2 μm depth, for example, the active layer 2 can be controlled, with good reproducibility; to be thinner than 0.04 μm in the portion 3a above the ridge 8a and to be as thick as 0.06 μm in the portion 3b above the depression 9. In a laser device thus formed, the optical power density is lowered due to weak light confinement in the thin active layer portions 3a near the mirror facets, while the threshold current is maintained as low as 40–50 mA by the thick active layer portion 3b above the depression 9. As a result, continuous output of 30 mW can be steadily obtained at relatively higher temperature of 60° C.

Although a laser device having a loss guide for the transverse mode has been described in the above embodiment, it will be understood that the present invention is also applicable to a laser device having any other refractive index waveguide or a gain waveguide.

Figure 3:
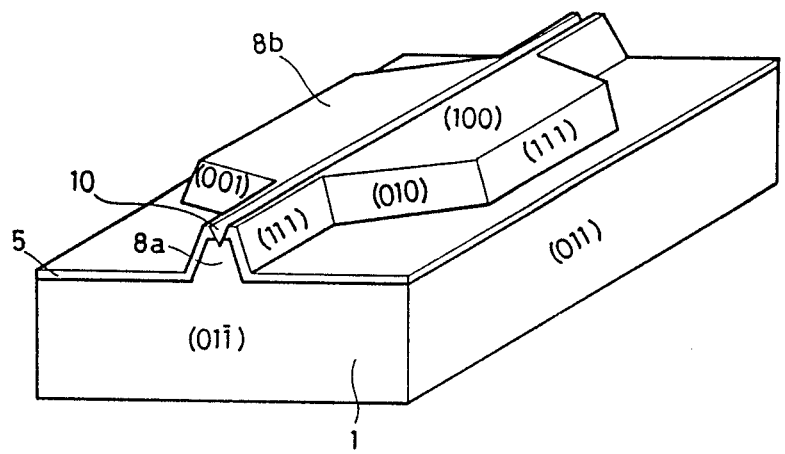
FIG. 3 is a perspective view of a ridged substrate and a current-blocking layer thereon used in the prior art.
Figure 6:
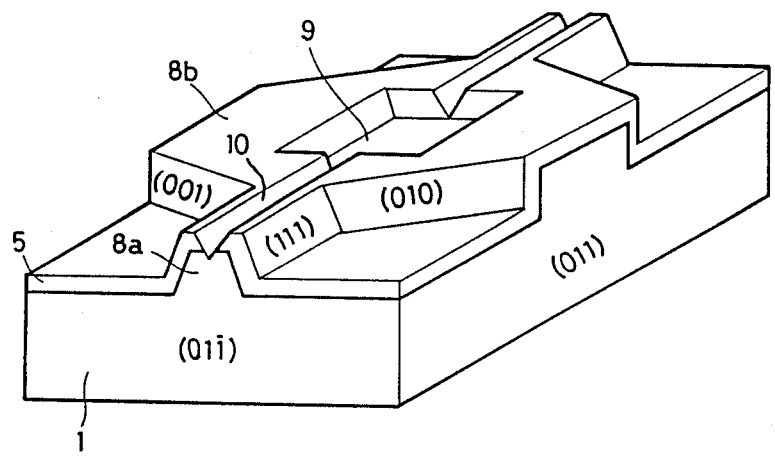
FIG. 6 is a perspective view of a ridged substrate and a current-blocking layer thereon which may be used in the present invention.

Further, it goes without saying that a substrate such as that shown in FIG. 6 can also be used in the present invention. The substrate of FIG. 6, which of course has a ridge 8a, 8b and a depression 9, is covered with a current-blocking layer 5 which has a slit opened by a narrow groove 10 along the center axis of the ridge similarly to the prior art substrate of FIG. 3.

Still further, although a laser device of an AlGaAs system has been described in the above embodiment, it goes without saying that the present invention is also applicable to a laser device of any other alloy system of elements in the groups III and V or in the groups II and VI in the periodic table.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. A method for fabricating a semiconductor laser device, comprising the steps of:
   preparing a substrate;
   forming a ridge on a main surface of said substrate from one end to the opposite end, wherein width of said ridge is narrower in regions near both the ends and wider in a middle region;
   forming a depression in the wider region of said ridge;
   forming a narrow groove, narrower than said depression, along the surface of said ridge from said one end to said opposite end;
   forming a first clad layer over the main surface of said substrate;
   forming an active layer on said first clad layer, whereby thickness of said active layer is made thinner in portions just above said narrower ridge regions and made thicker in portion just above said wider ridge region; and
   forming a second clad layer on said active layer.

2. A method in accordance with claim 1, wherein said first clad layer and said active layer are grown by liquid phase epitaxy.

3. A method in accordance with claim 1 further comprising a step of forming a current-blocking layer which has a slit along the center axis of said ridge.

4. A method in accordance with claim 3, wherein said current-blocking layer is grown by liquid phase epitaxy and provided between said substrate and said first clad layer.

5. A method in accordance with claim 3, wherein said device of an AlGaAs/GaAs system.

6. A method for fabricating a semiconductor laser device, comprising the steps of:
   preparing a substrate;
   forming a ridge on a main surface of said substrate from one end to the opposite end, wherein width of said ridge is narrower in regions near both the ends and wider in a middle region;

forming a depression in the wider region of said ridge;

forming a first clad layer over the main surface of said substrate;

forming an active layer on said first clad layer, whereby thickness of said active layer is made thinner in portions just above said narrower ridge regions and made thicker in portion just above said wider ridge region;

forming a second clad layer on said active layer; and forming a current-blocking layer which has a slit along the center axis of said ridge and wherein said current-blocking layer is provided on said second clad layer.

* * * * *